(12) United States Patent
Saito et al.

(10) Patent No.: US 9,911,803 B2
(45) Date of Patent: Mar. 6, 2018

(54) SEMICONDUCTOR DEVICE

(71) Applicants: TOYOTA JIDOSHA KABUSHIKI KAISHA, Toyota-shi, Aichi-ken (JP); DENSO CORPORATION, Kariya-shi, Aichi-ken (JP)

(72) Inventors: Jun Saito, Nagoya (JP); Sachiko Aoi, Nagoya (JP); Yukihiko Watanabe, Nagoya (JP); Toshimasa Yamamoto, Ichinomiya (JP)

(73) Assignees: TOYOTA JIDOSHA KABUSHIKI KAISHA, Toyota (JP); DENSO CORPORATION, Kariya (JP)

(*) Notice: Subject to any disclaimer, the term of this patent is extended or adjusted under 35 U.S.C. 154(b) by 0 days.

(21) Appl. No.: 15/023,498

(22) PCT Filed: Sep. 22, 2014

(86) PCT No.: PCT/IB2014/001887
§ 371 (c)(1),
(2) Date: Mar. 21, 2016

(87) PCT Pub. No.: WO2015/044738
PCT Pub. Date: Apr. 2, 2015

(65) Prior Publication Data
US 2016/0211319 A1 Jul. 21, 2016

(30) Foreign Application Priority Data
Sep. 24, 2013 (JP) .................. 2013-197379

(51) Int. Cl.
*H01L 29/06* (2006.01)
*H01L 29/10* (2006.01)
(Continued)

(52) U.S. Cl.
CPC ...... *H01L 29/0634* (2013.01); *H01L 29/0623* (2013.01); *H01L 29/1095* (2013.01);
(Continued)

(58) Field of Classification Search
None
See application file for complete search history.

(56) References Cited

U.S. PATENT DOCUMENTS 6,037,632 A * 3/2000 Omura .................. H01L 21/74
257/139
8,076,718 B2 * 12/2011 Takaya ................ H01L 29/0623
257/330
(Continued)

FOREIGN PATENT DOCUMENTS

JP        H09-191109 A    7/1997
JP        2006-128507 A   5/2006
(Continued)

*Primary Examiner* — Erik Kielin
(74) *Attorney, Agent, or Firm* — Oliff PLC

(57) ABSTRACT

A semiconductor device includes a semiconductor substrate. The element region of the semiconductor substrate includes a first body region having a first conductivity type, a first drift region having a second conductivity type, and a plurality of first floating regions, each the first floating regions having the first conductivity type. The termination region includes a second drift region having the second conductivity type, and a plurality of second floating regions, each of the second floating regions having the first conductivity type. The each of the second floating regions is surrounded by the second drift region. When a depth of a center of the first drift region is taken as a reference depth, at least one of the second floating regions is placed closer to the reference depth than each of the first floating regions.

9 Claims, 13 Drawing Sheets

(51) Int. Cl.
  *H01L 29/423* (2006.01)
  *H01L 29/739* (2006.01)
  *H01L 29/78* (2006.01)

(52) U.S. Cl.
  CPC ...... *H01L 29/4236* (2013.01); *H01L 29/7397* (2013.01); *H01L 29/7811* (2013.01); *H01L 29/7813* (2013.01); *H01L 29/0661* (2013.01); *H01L 29/42368* (2013.01)

(56) References Cited

U.S. PATENT DOCUMENTS

| | | | |
|---|---|---|---|
| 2008/0087951 A1* | 4/2008 | Takaya | H01L 29/0623 257/334 |
| 2009/0057757 A1 | 3/2009 | Hokomoto et al. | |
| 2015/0084124 A1 | 3/2015 | Saito et al. | |

FOREIGN PATENT DOCUMENTS

| | | |
|---|---|---|
| JP | 2008-135522 A | 6/2008 |
| JP | 2009-059860 A | 3/2009 |
| JP | 2015-065238 A | 4/2015 |

\* cited by examiner

SEMICONDUCTOR DEVICE

BACKGROUND OF THE INVENTION

1. Field of the Invention

The present invention relates to a semiconductor device.

2. Description of Related Art

Japanese Patent Application Publication No. 2008-135522 (JP 2008-135522 A) describes a semiconductor device in which an element region and a termination region are formed in a semiconductor substrate. In the element region, a plurality of linear trench gate electrodes is formed, and in the termination region, a plurality of termination trenches provided around the plurality of trench gate electrodes is formed. P-type floating regions are formed on bottom faces of the termination trenches. The floating regions are surrounded by an n-type drift region. The semiconductor device is configured such that an interval between floating regions adjacent to each other is optimized so as to improve uniformity of breakdown voltage in the termination region.

In recent years, development of a semiconductor device with low loss has been desired. As one approach to attain low loss of a semiconductor device, an on-resistance may be reduced. In order to reduce the on-resistance, it is conceivable that an impurity concentration in a drift region is increased. However, if the impurity concentration of the drift region is increased, respective breakdown voltages in an element region and in a termination region might be decreased. When the breakdown voltage of the termination region becomes the breakdown voltage of the element region or less, avalanche breakdown occurs in the termination region. Generally, the termination region has a smaller area than the element region. Therefore, if a breakdown current flows through the termination region, a temperature of the termination region easily becomes high, which is unfavorable. Accordingly, there is such a demand that the breakdown voltage of the termination region is set higher than the breakdown voltage of the element region so that avalanche breakdown occurs in the element region.

SUMMARY OF THE INVENTION

The present invention provides a semiconductor device that is able to maintain a breakdown voltage in a termination region even when an impurity concentration of a drift region is relatively high.

A semiconductor device according to an aspect of the present invention includes a semiconductor substrate. The semiconductor substrate has an element region and a termination region, the termination region surrounding the element region. The element region includes a first body region, a first drift region and a plurality of first floating regions, the first body region having a first conductivity type, the first drift region having a second conductivity type, and each of the first floating regions having the first conductivity type. The first body region is placed in a range facing a top face of the semiconductor substrate. The first drift region makes contact with a bottom face of the first body region. Each the first floating regions is surrounded by the first drift region. The termination region includes a second drift region and a plurality of second floating regions, the second drift region having the second conductivity type, and each of the second floating regions having the first conductivity type. Each of the second floating regions is surrounded by the second drift region. The second floating regions surround an outer periphery of the element region. When a depth of a center of the first drift region in a thickness direction of the semiconductor substrate is taken as a reference depth, at least one of the second floating regions is placed closer to the reference depth than each of the first floating regions.

In the semiconductor device according to the aspect of the present invention, the plurality of the first floating regions is formed in the element region. Further, the plurality of the second floating regions is formed in the termination region. When a reverse bias voltage is applied to the semiconductor device, the peak of an electric field intensity is formed on junction surfaces between the first floating regions and the first drift region and on junction surfaces between the second floating regions and the second drift region. In the semiconductor device, at least one of the second floating regions is placed closer to the reference depth than the first floating regions (in the following description, the second floating region that is placed relatively closer to the reference depth is also referred to as the "reference-depth-side second floating region"). Because of this, the reference-depth-side second floating region can more evenly distribute an electric field in the thickness direction of the semiconductor substrate than the first floating regions. Accordingly, a peak value of the electric field intensity of the reference-depth-side second floating region becomes lower than a peak value of the electric field intensity of the first floating regions. As a result, it is possible to attain a relatively high breakdown voltage of the termination region as compared with a breakdown voltage of the element region, and even in a case where an impurity concentration of the drift region is relatively high, it is possible to maintain the breakdown voltage in the termination region.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Figure 1:
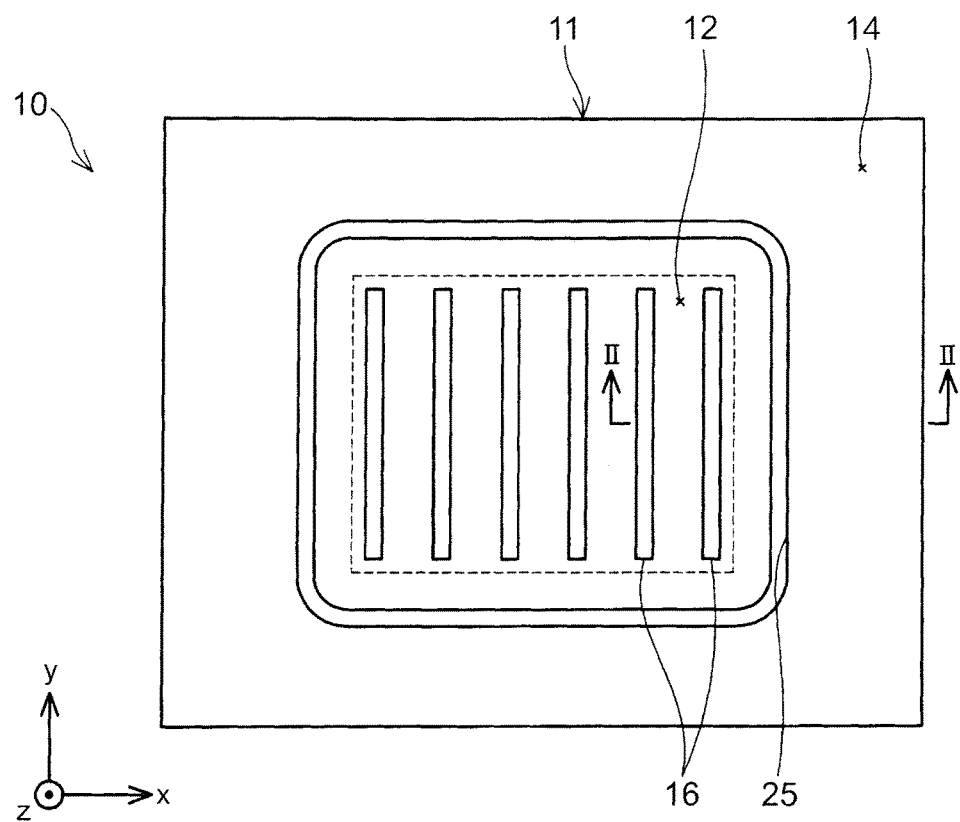
FIG. 1 is a plane view of a semiconductor device according to a first embodiment of the present invention.

The following describes main features of an embodiment. Note that technical elements described below are technical elements independent from each other, and exhibit a technical usability solely or in various combinations.

In an embodiment of the present invention, a second body region may be formed in part of the termination region, the second body region having the first conductivity type, being placed in a range facing the top face of the semiconductor substrate and being formed continuously from the first body region. The second drift region may make contact with a bottom face and side faces of the second body region. When the semiconductor substrate is viewed in a plane manner, at least one of the second floating regions may have an overlapping portion with the second body region. When a reverse bias voltage is applied to the semiconductor device, an electric field intensity of a junction surface between the second body region and the second drift region increases. According to the above configuration, when the semiconductor substrate is viewed in a plane manner, at least one of the plurality of second floating regions has an overlapping portion with the second body region (hereinafter, the second floating region placed below the second body region is also referred to as a lower second floating region). Accordingly, an electric field in a thickness direction of the semiconductor substrate can be shared by two regions, i.e., the second body region and the lower second floating region. This makes it possible to decrease an electric field intensity of the junction surface between the second body region and the second drift region.

In an embodiment of the present invention, when the semiconductor substrate is viewed in a plane manner, at least two of the second floating regions may have overlapping portions that overlap each other. According to the above configuration, the electric field in the thickness direction of the semiconductor substrate is shared by the plurality of the second floating regions in the overlapping portions. This makes it possible to increase a breakdown voltage of the termination region to be relatively higher than a breakdown voltage of the element region.

In the above embodiment of the present invention, when the semiconductor substrate is viewed in a plane manner, the at least two of the second floating regions may be placed closest to the element region among the second floating regions. The electric field is easy to concentrate on that part of the termination region which is closer to the element region, and its breakdown voltage is easy to decrease. According to the above configuration, the electric field in the thickness direction of the semiconductor substrate is shared by the plurality of second floating regions in the overlapping portions. This makes it possible to improve the breakdown voltage of that part of the termination region which is closer to the element region.

In an embodiment of the present invention, when the semiconductor substrate is viewed in a plane manner, at least one of the first floating regions and at least one of the second floating regions may respectively have overlapping portions that overlap each other. Avalanche breakdown is easy to occur in a boundary portion between the element region and the termination region due to a decrease in the breakdown voltage. According to the above configuration, the electric field in the thickness direction of the semiconductor substrate is shared by the first floating region and the second floating region in the overlapping portions. This makes it possible to improve the breakdown voltage in the boundary portion and to restrain an occurrence of the avalanche breakdown.

In an embodiment of the present invention, the first floating regions may be placed at a predetermined interval from an element-region side toward a termination-region side in a predetermined depth in the thickness direction. In the following description, the predetermined depth, in the thickness direction of the semiconductor substrate, in which the first floating regions are placed is also referred to as a "first floating region depth." Further, in the following description, an interval between the first floating regions in a direction from the element-region side toward the termination-region side is also referred to as a "first floating region interval." According to the above configuration, respective depletion layers expanding from adjacent first floating regions are connected to each other generally at the same timing in the first floating regions. This makes it possible to obtain a uniform breakdown voltage in the element region. As a result, it is possible to eliminate those parts in the element region in which the breakdown voltage is locally decreased.

In an embodiment of the present invention, an interval between the first floating region and one of the second floating regions may be ½ or less of the predetermined interval, the one of the second floating regions being adjacent to the first floating region. According to the above configuration, before respective depletion layers expanding from adjacent first floating regions are connected to each other, a depletion layer expanding from a first floating region closest to the termination region reaches a second floating region placed closest to the element region. This makes it possible to maintain the breakdown voltage of the termination region preferentially, and to attain a relatively high breakdown voltage of the termination region as compared with the breakdown voltage of the element region.

In the above embodiment of the present invention, the termination region may include a dummy trench, an insulator, and a third floating region. The dummy trench penetrates through the second body region and extends in the second drift region. The insulator is placed in the dummy trench. The third floating region is placed in a bottom portion of the dummy trench or below the dummy trench, and has the first conductivity type. The dummy trench may surround the outer periphery of the element region. The third floating region may be placed in the predetermined depth and surrounded by the second drift region. An interval between the third floating region and one of the second floating regions may be a half or less of the predetermined interval, the one of the second floating regions being adjacent to the third floating region and being located at an opposite side to the element region with respect to the third floating region. According to the above configuration, it is possible to improve the breakdown voltage of the termination region by forming the dummy trench. Further, since the third floating region is placed below the second body region, it is possible to improve the breakdown voltage of the second body region. Further, before respective depletion layers expanding from adjacent first floating regions are connected to each other, a depletion layer expanding from the third floating region reaches a second floating region adjacent to that side of the third floating region which is opposite to the element region. This makes it possible to maintain the breakdown voltage of the termination region preferentially.

In the above embodiment of the present invention, the third floating region may surround the bottom portion of the dummy trench.

In an embodiment of the present invention, the element region may include a gate electrode and a second insulator. The gate electrode is placed inside a gate trench and is opposite to the first body region, the gate trench penetrating through the first body region and extending in the first drift region. The second insulator is placed between the gate electrode and an inner wall of the gate trench. The first floating region in the element region may surround a bottom portion of the gate trench.

Figure 2:
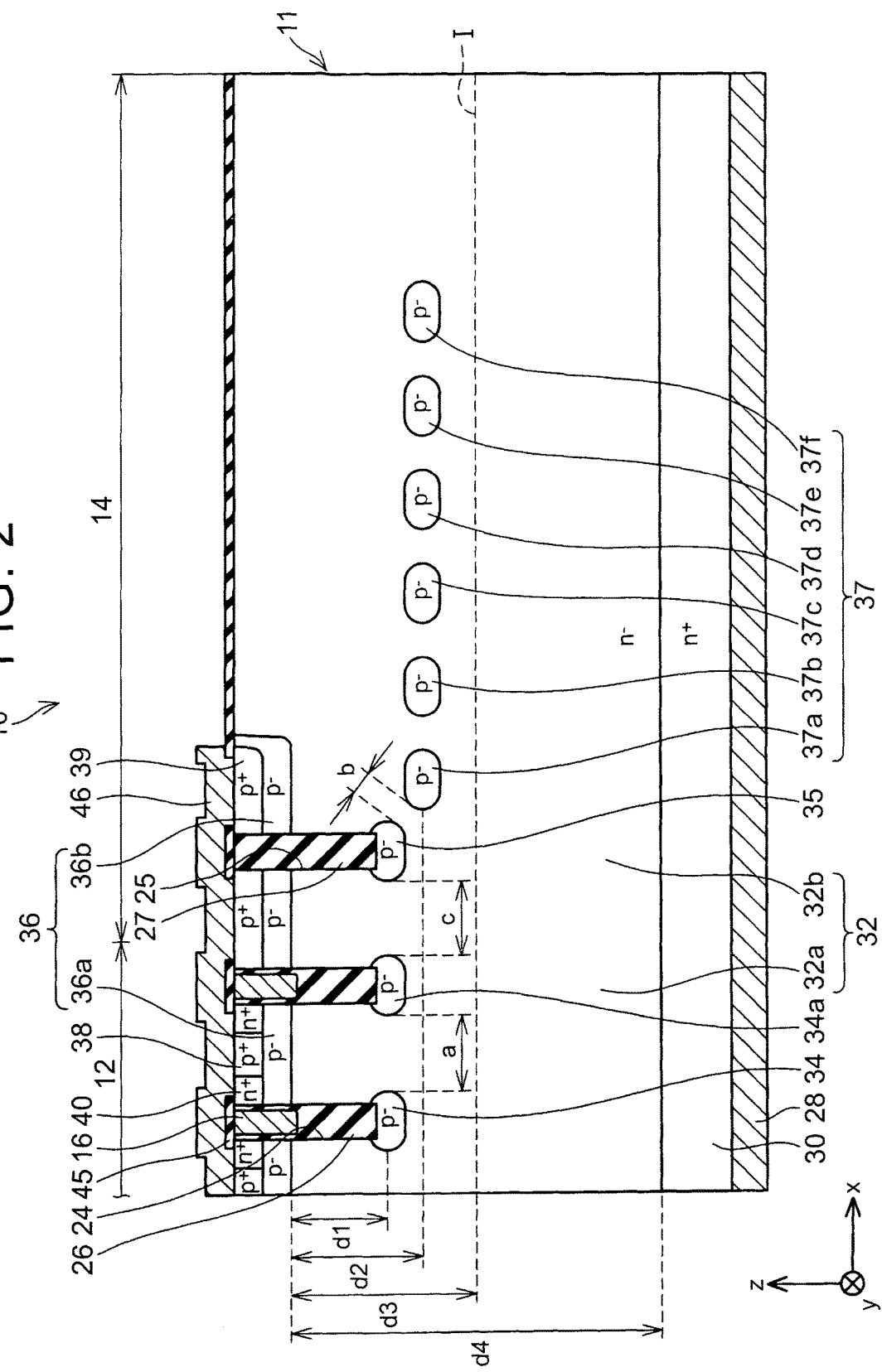
FIG. 2 is a drawing of a longitudinal section of the semiconductor device according to the first embodiment of the present invention.
Figure 3:
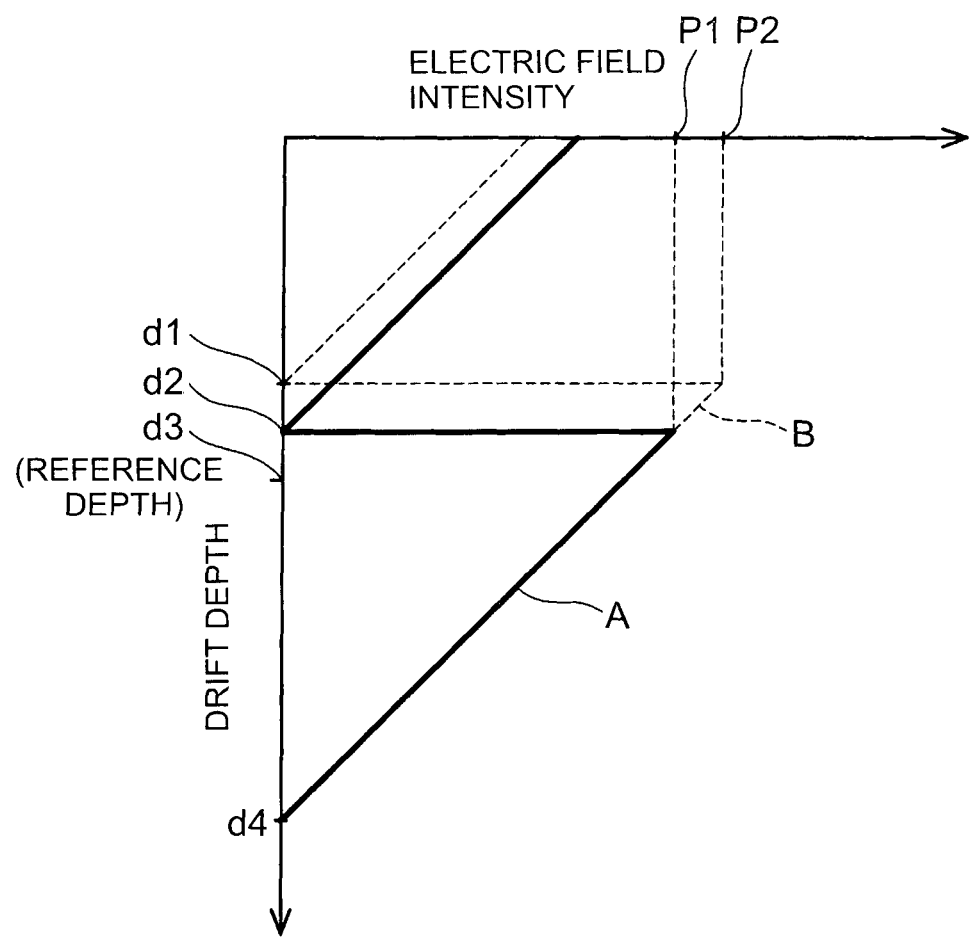
FIG. 3 illustrates a relationship between an electric field intensity of a drift region and a depth of the drift region.

The following describes a semiconductor device 10 of a first embodiment with reference to FIGS. 1 to 3. In FIG. 1, an insulator film and an electrode on a semiconductor substrate 11 are not illustrated so as to facilitate viewing of the figure. As illustrated in FIG. 1, the semiconductor device 10 is formed in the semiconductor substrate 11. An element region 12 and a termination region 14 are formed in the semiconductor substrate 11. The termination region 14 surrounds the element region 12. A SiC substrate is used as the semiconductor substrate 11. Note that contraction scales of semiconductor devices 10 to 1010 in the following embodiments (including modifications) are different from an actual contraction scale.

Six gate electrodes 16 are formed in the element region 12. The six gate electrodes 16 extend in a y-direction in FIG. 1, and are arranged in an x-direction in FIG. 1 at a predetermined interval. One dummy trench 25 is formed in the termination region 14. The dummy trench 25 is provided so as to surround the element region 12.

Here, a configuration of the element region 12 is described. As illustrated in FIG. 2, an insulated-gate semiconductor element is formed in the element region 12. That is, in a part of the element region 12 which faces a top face of the semiconductor substrate 11, an n+ type source region 40 and a p+ type body contact region 38 are formed. The body contact region 38 is formed so as to make contact with the source region 40.

A p– type body region 36a is formed below the source region 40 and the body contact region 38. An impurity concentration of the body region 36a is set lower than an impurity concentration of the body contact region 38. The body region 36a makes contact with the source region 40 and the body contact region 38. Accordingly, the source region 40 is surrounded by the body region 36a and the body contact region 38. The body region is formed even in part of the termination region 14. In the following description, a p– type body region formed in the termination region 14 is referred to as a "body region 36b," and the body region 36a and the body region 36b are generally referred to as a "body region 36." The body region 36a and the body region 36b are a continuous region, and are formed integrally. In view of this, a bottom face of the body region 36a and a bottom face of the body region 36b are placed at the same height in a z-direction. In the present embodiment, the body region 36 has a thickness of about 1 to 2 μm. Note that the p– type body region 36a and the body contact region 38 may be considered as the first body region of the present invention. The body region 36b and a body contact region 39 (described later) may be considered as the second body region of the present invention.

An n– type drift region 32a is formed below the body region 36a. The drift region is formed in an entire surface of the semiconductor substrate 11. In the following description, an n– type drift region formed in the termination region 14 is referred to as a "drift region 32b," and the drift region 32a and the drift region 32b are generally referred to as a "drift region 32." The drift region 32a and the drift region 32b are a continuous region, and are formed integrally. In the present embodiment, the drift region 32a has a thickness of about 10 μm (that is, a thickness of the drift region 32b is about 11 to 12 μm). Note that the thickness of the drift region 32 is not limited to this, and may be changed according to a target breakdown voltage of the semiconductor device 10 as appropriate. In the present embodiment, when the drift region 32 has such a thickness, it is possible to maintain a breakdown voltage of about 1200 V, but when the drift region is formed to have a larger thickness, it is possible to secure a larger breakdown voltage. The drift region 32a makes contact with the bottom face of the body region 36a. The drift region 32a is separated from the source region 40 by the body region 36a. In the drift region 32a, p– type diffusion regions 34 are formed in a range surrounding bottom portions of the after-mentioned gate trenches 24. The diffusion regions 34 make contact with respective insulators 26 (that is, the bottom portions of the gate trenches 24) below the gate electrodes 16. The diffusion regions 34 are surrounded by the drift region 32a. Hereby, the diffusion regions 34 are separated from the body region 36a. The diffusion regions 34 are formed at an interval a in a position of a depth d1 from the bottom face of the body region 36a. Note that the n– type drift region 32a may be considered as the first drift region of the present invention. The drift region 32b may be considered as the second drift region of the present invention. The diffusion region 34 may be considered as the first floating region of the present invention.

An n+ type drain region 30 is formed in a range facing a bottom face of the semiconductor substrate 11. The drain region 30 is formed in an entire surface of the semiconductor substrate 11. An impurity concentration of the drain region 30 is set higher than an impurity concentration of the drift region 32. In the present embodiment, the drain region 30 has a thickness of about 350 μm. The drain region 30 makes contact with a bottom face of the drift region 32. The drain region 30 is separated from, the body region 36 by the drift region 32. Note that a commercially available SiC substrate can be used for the drain region 30. In that case, a semiconductor layer serving as the drift region 32 (including the body region 36) can be formed by epitaxial growth. Then, an ion implantation is performed on the semiconductor layer thus formed by epitaxial growth. Hereby, the body region 36 can be formed. In view of this, the semiconductor substrate 11 is constituted by the commercially available SiC substrate, and the semiconductor layer epitaxially grown on the SiC substrate.

The gate trenches 24 are formed on the top face of the semiconductor substrate 11. The gate trenches 24 penetrate through the source region 40 and the body region 36a, and bottom ends thereof extend in the drift region 32a. In the present embodiment, the gate trenches 24 have a depth of about 3 μm. In the gate trenches 24, the gate electrodes 16 are formed. The gate electrodes 16 are each formed so that its bottom end is slightly deeper than the bottom face of the body region 36a. An insulator 26 is filled in between a wall surface of the gate trench 24 and the gate electrode 16 (that is, lateral sides and a lower side of the gate electrode 16). Because of this, the gate electrode 16 is opposite to the body region 36a and the source region 40 via the insulator 26. Further, a cap insulator film 45 is formed on a top face of the gate electrode 16.

A drain electrode 28 is formed on the bottom face of the semiconductor substrate 11. The drain electrode 28 is formed on an entire surface of the semiconductor substrate 11. The drain electrode 28 makes Ohmic contact with the drain region 30. A source electrode 46 is formed on the top surface of the semiconductor substrate 11. The source electrode 46 is formed in the element region 12 and in part of the termination region 14. In the element region 12, the source electrode 46 makes Ohmic contact with the source region 40 and the body contact region 38. In the termination region 14, the source electrode 46 makes Ohmic contact with the body contact region 39 (described later). The source electrode 46 is insulated from the gate electrode 16 by the cap insulator film 45.

The following describes the termination region 14. As illustrated in FIG. 2, one dummy trench 25, one diffusion region 35, and six diffusion regions 37 are formed in the termination region 14. In part of the termination region 14, the body contact region 39 is formed in a range facing the top surface of the semiconductor substrate 11. The body region 36b is formed below the body contact region 39. The body region 36b makes contact with a bottom face and side faces of the body contact region 39. The drift region 32b is formed below the body region 36b. The drift region 32b makes contact with a bottom face and side faces of the body region 36b. The dummy trench 25 penetrates through the body contact region 39 and the body region 36b, so that a bottom end thereof extends in the drift region 32b. The bottom end of the dummy trench 25 is placed at the same depth as a bottom end of the gate trench 24. The dummy trench 25 is filled with an insulator 27. The p− type diffusion region 35 is formed in a range surrounding a bottom portion of the dummy trench 25. Because of this, the diffusion region 35 is also provided so as to surround the element region 12. The diffusion region 35 is surrounded by the drift region 32b. The diffusion region 35 is formed in a depth that is generally the same depth as the diffusion regions 34 (that is, the depth d1). Further, the diffusion region 35 is formed at an interval c from that diffusion region 34 (hereinafter also referred to as an end-side diffusion region 34a) in the element region 12 which is formed closest to the termination region 14. Note that the diffusion region 35 may be considered as the third floating region of the present invention.

In the termination region 14, six p− type diffusion regions 37 are formed in the drift region 32b. In the following description, the respective diffusion regions 37 are referred to as a diffusion region 37a, a diffusion region 37b, . . . , a diffusion region 37f sequentially toward the x-direction. The diffusion regions 37 are surrounded by the drift region 32b. In the present embodiment, the diffusion regions 37a to 37f are formed generally at even intervals in a position of a depth d2 from the bottom face of the body region 36b. When the semiconductor substrate 11 is viewed in a plane manner, the diffusion regions 37a to 37f surround an outer periphery of the diffusion region 35. Further, the diffusion region 37a is placed below the bottom face of the body region 36b. In other words, when the semiconductor substrate 11 is viewed in a plane manner, the diffusion region 37a overlaps the bottom face of the body region 36b. Note that the diffusion regions 37 may be considered as the second floating regions of the present invention.

Here, a positional relationship between the diffusion regions 34, 35, 37 is described below with reference to FIG. 2. A broken line I indicates a position of a depth d3 from the bottom face of the body region 36a. When a depth from the bottom face of the body region 36a to a top face of the drain region 30 is assumed d4, a relationship of d4=2×d3 is established. That is, the broken line I indicates a center of a thickness of the drift region 32a. In the following description, the depth d3 is also referred to as a "reference depth." Note that the broken line I indicates the center of the thickness of the drift region 32a, but does not indicate a center of a thickness of the drift region 32b. As illustrated in FIG. 2, a distance (d3−d2) between the diffusion regions 37a to 37f and the broken line I is shorter than a distance (d3−d1) between the diffusion regions 34, 35 and the broken line I. In other words, the diffusion regions 37a to 37f are placed closer to the reference depth than the diffusion regions 34 and the diffusion region 35. Accordingly, the diffusion region 37a is placed obliquely downward relative to the diffusion region 35. The diffusion region 37a is placed to be always distanced at an interval b from the diffusion region 35 so as to surround the element region 12. Further, as described above, adjacent diffusion regions 34 are placed evenly at the interval a. A relationship of 2×b≤a is established between the interval a and the interval b. Further, in the present embodiment, the interval c between the end-side diffusion region 34a and the diffusion region 35 is generally the same as the interval a. However, this is not the only option, and a relationship of c<a may be established, for example.

Here, a formation method of the diffusion regions 34, 35, 37 is described below. Generally, diffusion regions are formed by an ion implantation. The diffusion regions 34 and the diffusion region 35 are formed by performing the ion implantation from the bottom portions of the gate trenches 24 and the bottom portion of the dummy trench 25, respectively. Hereby, the diffusion regions 34, 35 can be formed generally in the same depth. In the meantime, the diffusion regions 37 are formed by performing the ion implantation from the top face of the semiconductor substrate 11. In the present embodiment, the diffusion regions 34 are formed such that the depth d1 thereof is ⅓ or less of the depth d4 of the drift region 32a (that is, d1≤(⅓)*d4).

An insulator film 44 is formed on the top surface of the semiconductor substrate 11 in the termination region 14. The insulator film 44 covers part of a top face of the body contact region 39, part of a top face of the body region 36b, and a top face of the drift region 32b.

When the semiconductor device 10 is used, the drain electrode 28 is connected to a power supply potential, and the source electrode 46 is connected to a ground potential. When an electric potential applied to the gate electrodes 16 is less than a threshold electric potential, the semiconductor device 10 is turned off. In a state where the semiconductor device 10 is turned off, a depletion layer expands from a pn junction between the body region 36 and the drift region 32. When the depletion layer expanding from the pn junction reaches the diffusion regions 34, 35, respective depletion layers expand from pn junctions between the diffusion regions 34 and the drift region 32a, and from a pn junction between the diffusion region 35 and the drift region 32b.

When the electric potential applied to the gate electrodes 16 is the threshold electric potential or more, the semiconductor device 10 is turned on. When the semiconductor device 10 is turned on, a channel is formed in that part of the body region 36a which makes contact with the insulator 26. Hereby, electrons flow from the source electrode 46 to the drain electrode 28 through the source region 40, the channel of the body region 36a, the drift region 32a, and the drain region 30. That is, a current flows from the drain electrode 28 to the source electrode 46.

Next will be described advantages of the semiconductor device 10 of the first embodiment. A continuous line A in FIG. 3 indicates an electric field distribution of the drift region 32b where the diffusion regions 37 are formed, and a broken line B indicates an electric field distribution of the drift region 32a where the diffusion regions 34 are formed. As illustrated in FIG. 3, in the drift region 32b, a peak of an electric field intensity is formed in a position of the depth d2 where the diffusion regions 37 are formed, and its value is P1. Further, in the drift region 32a, a peak of an electric field intensity is formed in a position of the depth d1 where the diffusion regions 34 are formed, and its value is P2. In the first embodiment, the diffusion regions 37 are placed closer to the reference depth than the diffusion regions 34. In view of this, the diffusion regions 37 can more evenly distribute the electric field applied to the drift region 32 than the diffusion regions 34, which makes it possible to decrease the peak P1 of the electric field intensity in the position of the diffusion regions 37 to be smaller than the peak P2 of the electric field intensity in the position of the diffusion regions 34. In other words, when the diffusion regions are placed closer to the reference depth, it is possible to decrease the peak of the electric field intensity in comparison with a case where the diffusion regions are placed in a position distanced from the reference depth. This makes it possible to decrease the electric field intensity in the termination region 14 to be smaller than the electric field intensity of the element region 12. Accordingly, even in a case where a concentration of the drift region 32 is relatively high, it is possible to increase the breakdown voltage of the termination region 14 to be relatively higher than the breakdown voltage of the element region 12, thereby making it possible to maintain the breakdown voltage in the termination region 14 appropriately. This consequently allows avalanche breakdown to occur in the element region 12. Since the element region 12 has an area relatively larger than the termination region 14, a temperature thereof is hard to increase, so that the element region 12 can tolerate a large breakdown current. This makes it possible to increase an avalanche resistance of the semiconductor device 10.

Further, in the present embodiment, the body region 36b is also formed in part of the termination region 14. The body region 36b extends toward an end side (in the x-direction) of the semiconductor substrate 11 from the dummy trench 25. Since the electric field is easy to concentrate on the trench, when the body region 36b is formed as described above, it is possible to restrain the electric field from concentrating on the dummy trench 25. In a case where the dummy trench 25 is not formed, it is possible to restrain the electric field from concentrating on the gate trench 24 placed closest to the termination region 14. Further, in the present embodiment, the diffusion region 37a is placed below the body region 36b. Generally, when a reverse bias voltage is applied to the semiconductor device 10, the electric field concentrates on the pn junction between the body region 36b and the drift region 32b, and the breakdown voltage of the pn junction is easy to decrease. However, by placing the diffusion region 37a as such, it is possible to suppress the concentration of the electric field on the pn junction and to restrain a decrease in the breakdown voltage.

Further, in the present embodiment, six diffusion regions 34 are placed at the interval a in the same depth d1. Further, one diffusion region 35 is also placed in generally the same depth d1 as the diffusion regions 34. When a reverse bias voltage is applied, a depletion layer expands from the pn junction between the body region 36 and the drift region 32. By placing the diffusion regions 34, 35 in the same depth, the depletion layer reaches the diffusion regions 34, 35 at about the same timing. When the depletion layer reaches the diffusion regions 34, 35, respective depletion layers expand from the pn junctions between the diffusion regions 34 and the drift region 32a, and from the pn junction between the diffusion region 35 and the drift region 32b. The depletion layers generally expand from the diffusion regions 34 and from the diffusion region 35 generally at the same speed. Since the six diffusion regions 34 are placed at regular intervals, respective depletion layers expanding from adjacent diffusion regions 34 are connected to each other generally at the same time among the diffusion regions 34. This timing is assumed a first timing. The depletion layers are connected to each other in a general center between the adjacent diffusion regions 34. Meanwhile, the depletion layer expanding from the diffusion region 35 reaches the diffusion region 37a adjacent to the diffusion region 35. This timing is assumed a second timing. In the present embodiment, the interval b between the diffusion region 35 and the diffusion region 37a is set to a half or less of the interval a between the adjacent diffusion regions 34. Accordingly, the second timing comes earlier than the first timing. That is, depletion between the diffusion region 35 and the diffusion region 37a precedes depletion between the adjacent diffusion regions 34. This makes it possible to maintain the breakdown voltage of the termination region 14 preferentially, and to attain a relatively high breakdown voltage of the termination region 14 as compared with the breakdown voltage of the element region 12. Further, in the present embodiment, the interval c between the end-side diffusion region 34a and the diffusion region 35 is the same as the interval a, so that depletion between the end-side diffusion region 34a and the diffusion region 35 proceeds almost at the same time as the depletion between the adjacent diffusion regions 34. This makes it possible to maintain the breakdown voltage of the termination region 14 more appropriately.

When the depletion layer reaches the diffusion region 37a, a depletion layer expands from the diffusion region 37a and reaches the diffusion region 37b. Then, a depletion layer expands from the diffusion region 37b and reaches the diffusion region 37c. The depletion layer expands to the diffusion region 37f in this way. Note that the diffusion regions 37a to 37f are placed at even intervals in the present embodiment, but the intervals between the diffusion regions 37 may be different from each other, and may be set larger as they go toward the x-direction (a direction toward a substrate end). Further, the number of diffusion regions 37 is not limited to six. As more diffusion regions 37 are formed, it is possible to increase the breakdown voltage of the termination region 14. By adjusting respective intervals between the diffusion regions 37 and the numbers thereof according to that desired value of the breakdown voltage in the termination region 14 which is desired to be maintained, it is possible to attain a relatively high breakdown voltage of the termination region 14 as compared with the breakdown voltage of the element region 12.

According to the first embodiment of the present invention, it is possible to make use of physical properties of SiC used for the semiconductor substrate 11. SiC has a band gap wider than Si, and has dielectric breakdown strength that is about 10 times larger than that of Si. Since the dielectric breakdown strength of the semiconductor substrate is proportional to the one-half power of a doping concentration of the drift region, if the dielectric breakdown strength is 10 times larger than that of Si, the doping concentration of the semiconductor substrate can be 100 times larger than that of Si. Accordingly, when the SiC substrate is used, it is possible to largely decrease an on-resistance. However, if the impurity concentration of the drift region is increased, a speed of expansion of the depletion layer becomes slow. In view of this, in order to maintain the breakdown voltage in the termination region, it is necessary to shorten the interval between the diffusion regions formed in the termination region. However, from the viewpoint of processing accuracy, there is a limit to shortening of the interval between the diffusion regions, and it is difficult to largely increase the impurity concentration of the drift region in the termination structure of the related art. That is, the physical properties of SiC cannot be utilized effectively. In the meantime, according to the first embodiment of the present invention, even if the impurity concentration of the drift region is high, it is possible to maintain the breakdown voltage in the termination region. This makes it possible to make use of the physical properties of SiC having a wide band gap to the maximum, and it is possible to realize a low-loss semiconductor device. Note that the first embodiment of the present invention is also applicable to a Si substrate. For example, in a semiconductor device having a low breakdown voltage, the speed of expansion of a depletion layer may be slow, so that a concentration of a drift region can be increased. In view of this, according to the first embodiment of the present invention, it is possible to realize a semiconductor device which has a low on-resistance and which can maintain a breakdown voltage in a termination region.

Figure 4:
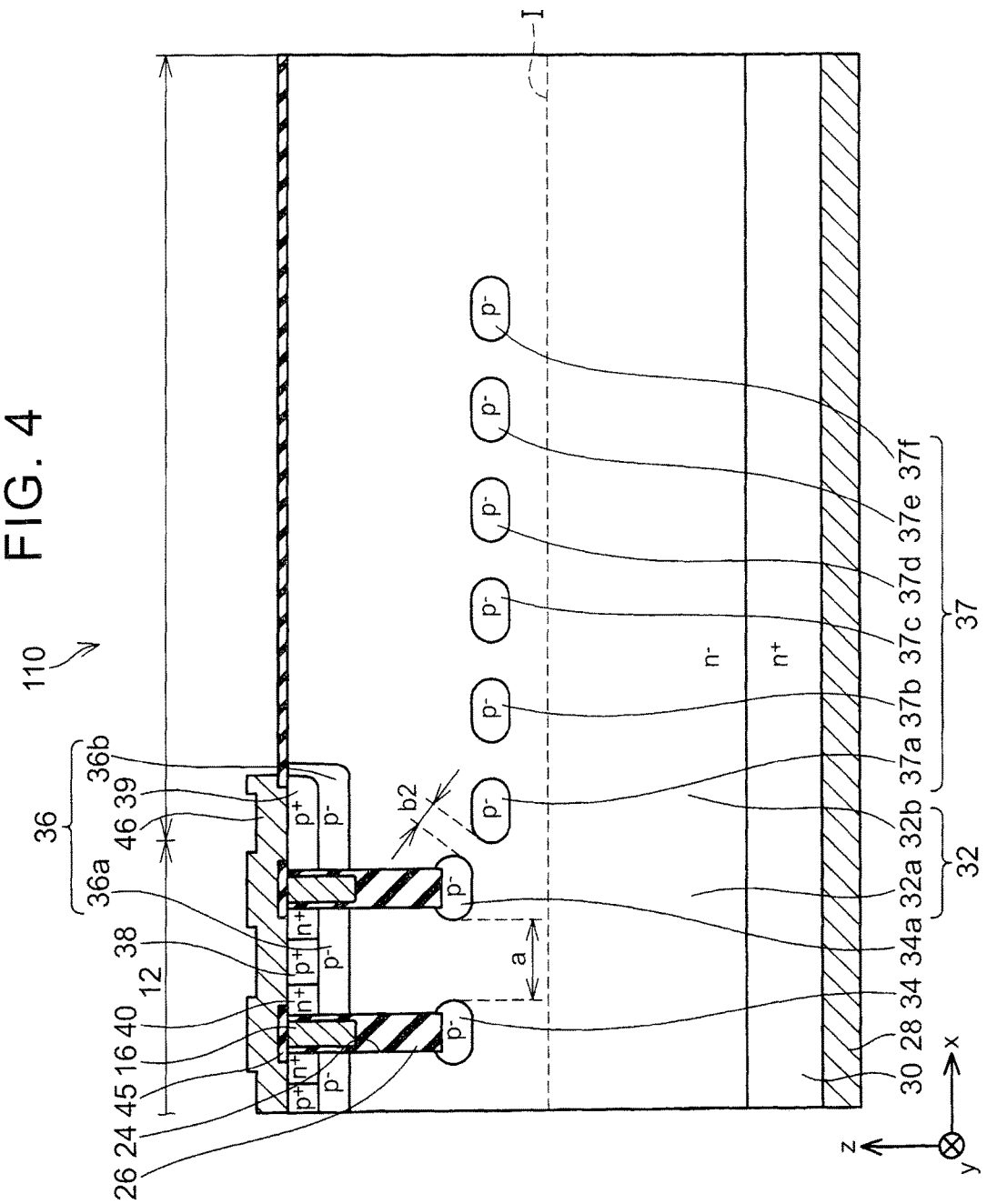
FIG. 4 is a drawing of a longitudinal section of a semiconductor device according to a first modification of the present invention.

Referring now to FIG. 4, a first modification of the present invention is described. The following description deals with only a point different from the first embodiment, and detailed descriptions thereof about the same configuration and operation as the first embodiment are omitted. The other embodiments and modification will be also described in the same manner.

In a semiconductor device 110 of the first modification, no dummy trench 25 and no diffusion region 35 are formed. Further, an interval b2 between an end-side diffusion region 34a and a diffusion region 37a is set to a half or less of an interval a between adjacent diffusion regions 34. According to this configuration, when a reverse bias voltage is applied to the semiconductor device 110, a depletion layer expanding from a pn junction between a body region 36 and a drift region 32 reaches each diffusion region 34, and a depletion layer expands from the each diffusion region 34. At this time, the depletion layer expanding from the end-side diffusion region 34a reaches the diffusion region 37a before the depletion layer expanding from the end-side diffusion region 34a is connected to a depletion layer expanding from its adjacent diffusion region 34. Even with this configuration, it is possible to yield the same effect as in the first embodiment.

Figure 5:
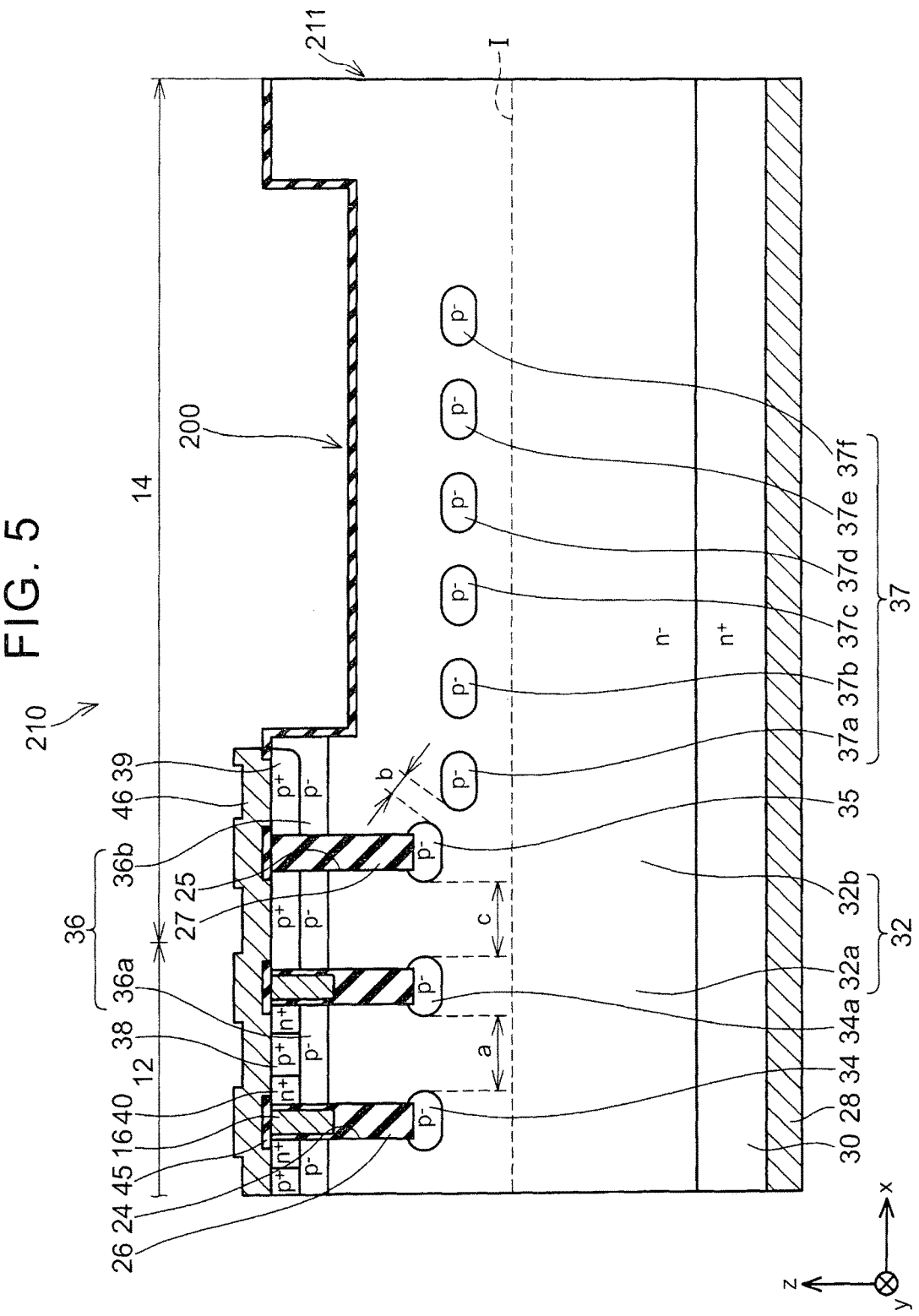
FIG. 5 is a drawing of a longitudinal section of a semiconductor device according to a second modification of the present invention.

Referring now to FIG. 5, a second modification of the present invention is described. In a semiconductor device 210 of the second modification, a mesa region 200 is formed in part of a termination region 14. The mesa region 200 has a shape in which part of a top face of a semiconductor substrate 211 is hollowed in a −z-direction. The mesa region 200 is provided so as to surround an element region 12. The mesa region 200 is hollowed to a position deeper than a bottom face of a body region 36b. An inner peripheral surface of the mesa region 200 makes contact with the bottom face of the body region 36b. In other words, by forming the mesa region 200, side surfaces of the body region 36b and corners thereof (portions that connect the side surfaces of the body region to the bottom face thereof) will not be formed in the semiconductor device 210. Generally, a depletion layer is hard to expand from a side surface or a corner of a body region. In view of this, when the mesa region 200 is formed so as not to form the side surfaces and the corners of the body region 36b, it is possible to restrain the electric field from concentrating on the side surfaces and the corners of the body region 36b. Accordingly, with this configuration, it is possible to yield the same effect as in the first embodiment. Further, it is possible to reduce an electric field intensity on a top face of the semiconductor substrate 211 in the termination region 14.

Figure 6:
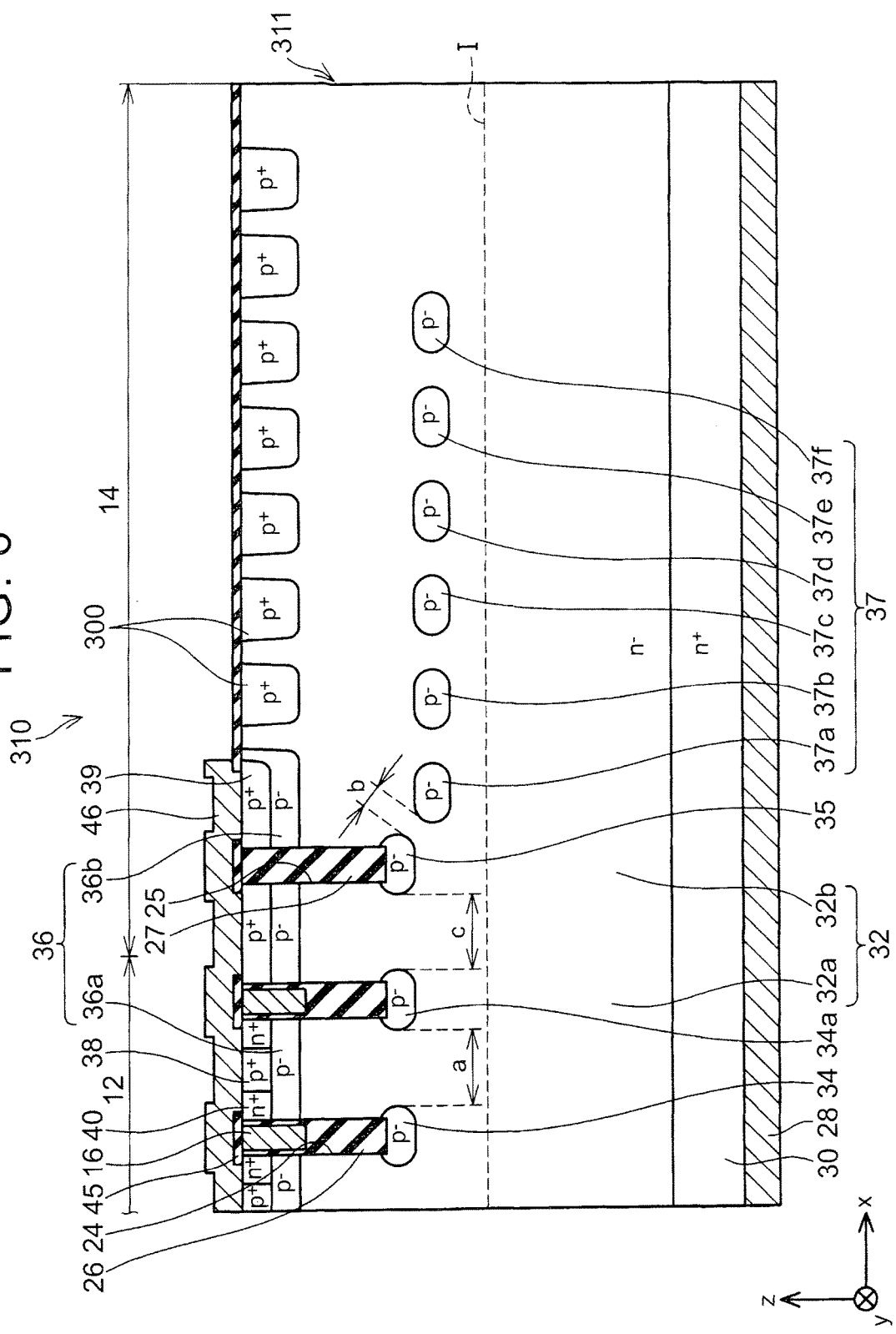
FIG. 6 is a drawing of a longitudinal section of a semiconductor device according to a third modification of the present invention.

Referring now to FIG. 6, a third modification of the present invention is described. In a semiconductor device 310 of the third modification, in a range facing a top face of a semiconductor substrate 311 in a termination region 14, a plurality of p+ type field limiting ring regions 300 (FLR regions 300) is formed so as to surround an element region 12. An impurity concentration of the FLR regions 300 is set higher than an impurity concentration of a body region 36. Even with this configuration, it is possible to yield the same effect as in the first embodiment, and it is possible to reduce an electric field intensity on the top face of the semiconductor substrate 311 in the termination region 14.

Figure 7:
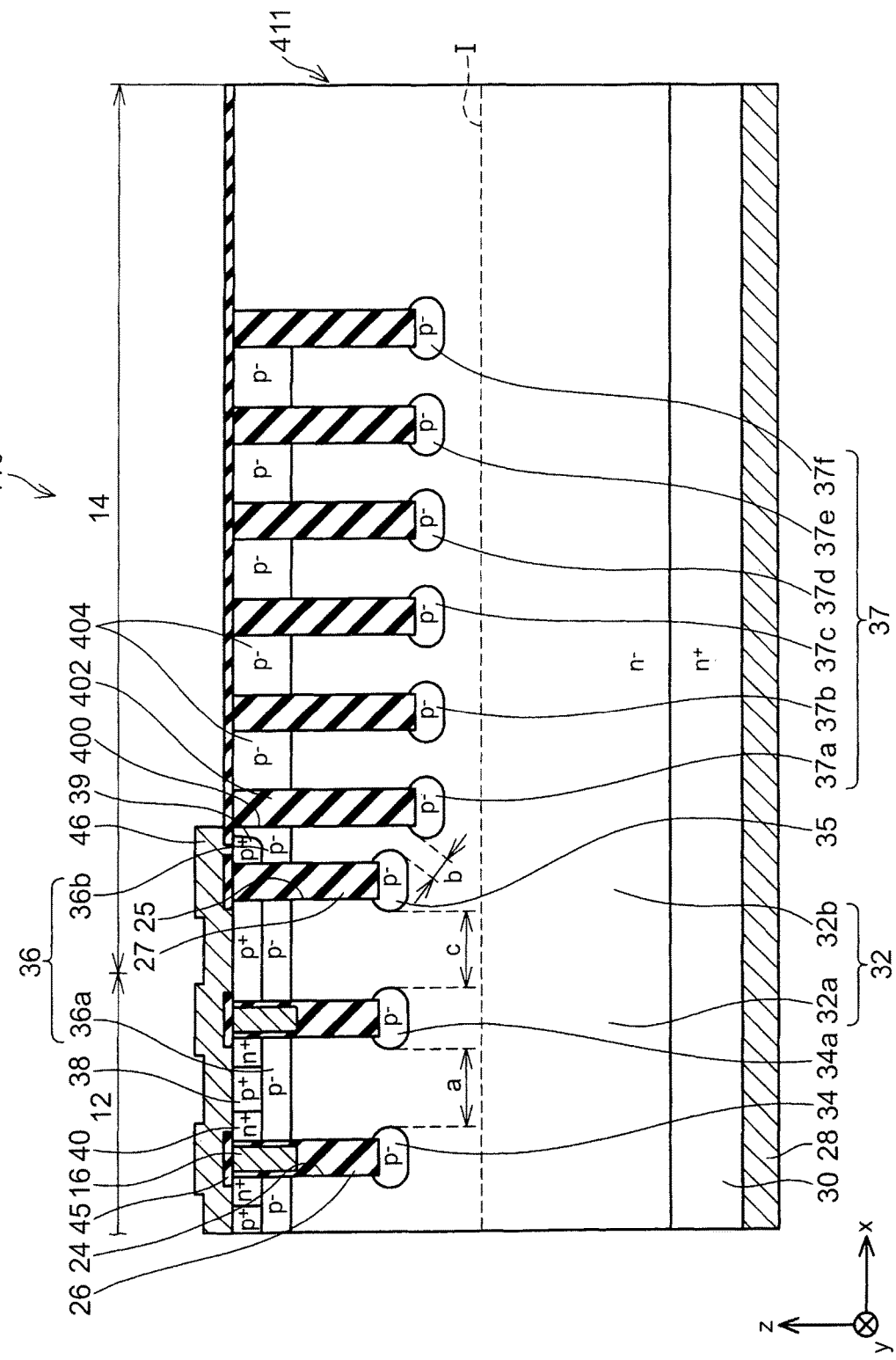
FIG. 7 is a drawing of a longitudinal section of a semiconductor device according to a fourth modification of the present invention.

Referring now to FIG. 7, a fourth modification of the present invention is described. In a semiconductor device 410 of the fourth modification, a body region 404 and six termination trenches 400 are formed in a termination region 14. The termination trenches 400 are provided so as to surround a dummy trench 25. The termination trenches 400 penetrate through the body region 404, so that bottom ends thereof extend in a drift region 32b (more strictly, a termination trench 400 closest to an element region 12 separates a body region 36b from the body region 404). Because of this, the body region 404 is kept at a floating electric potential. Bottom ends of the termination trenches 400 are formed deeper than bottom ends of gate trenches 24 and the dummy trench 25. The termination trenches 400 are each filled with an insulator 402. Diffusion regions 37 are formed in a range surrounding bottom portions of the termination trenches 400. Even with this configuration, it is possible to yield the same effect as in the first embodiment. Further, since the body region 404 having the floating electric potential is formed, it is possible to reduce an electric field intensity on a top face of the semiconductor substrate 411 in the termination region 14. Note that the body region 404 may not be formed.

Figure 8:
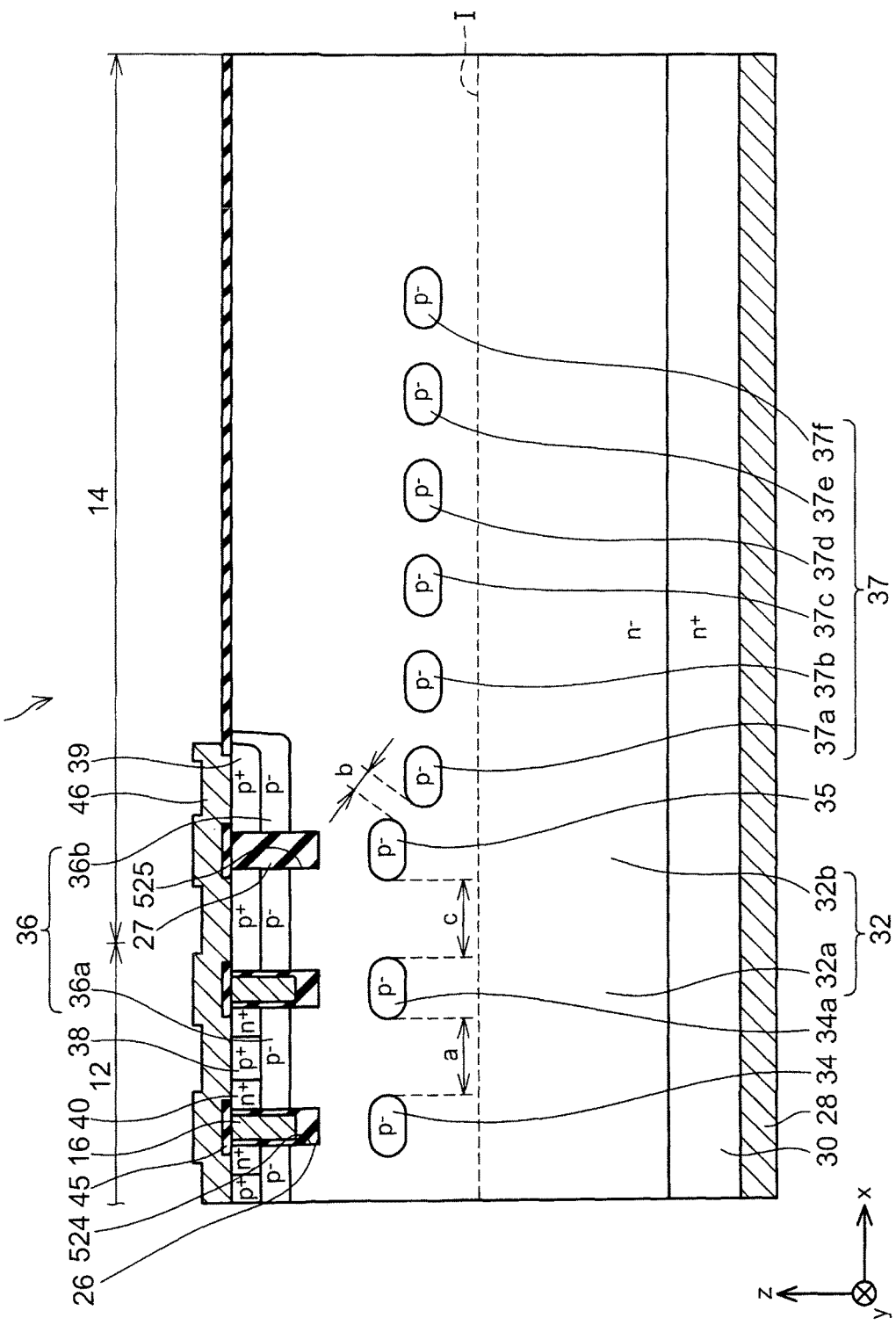
FIG. 8 is a drawing of a longitudinal section of a semiconductor device according to a fifth modification of the present invention.

Referring now to FIG. 8, a fifth modification of the present invention is described. In a semiconductor device 510 of the fifth modification, bottom ends of gate trenches 524 are made shallower than the bottom ends of the gate trenches 24. Hereby, bottom portions of the gate trenches 524 are separated from diffusion regions 34 by a drift region 32a. Similarly, a bottom end of a dummy trench 525 is made shallower than the bottom end of the dummy trench 25, so that a bottom portion of the dummy trench 525 is separated from a diffusion region 35 by a drift region 32b. How a depletion layer expands from a body region 36 when a reverse bias voltage is applied to the semiconductor device 510 is the same as the semiconductor device 10 of the first embodiment. Accordingly, even with this configuration, it is possible to yield the same effect as in the first embodiment.

Figure 9:
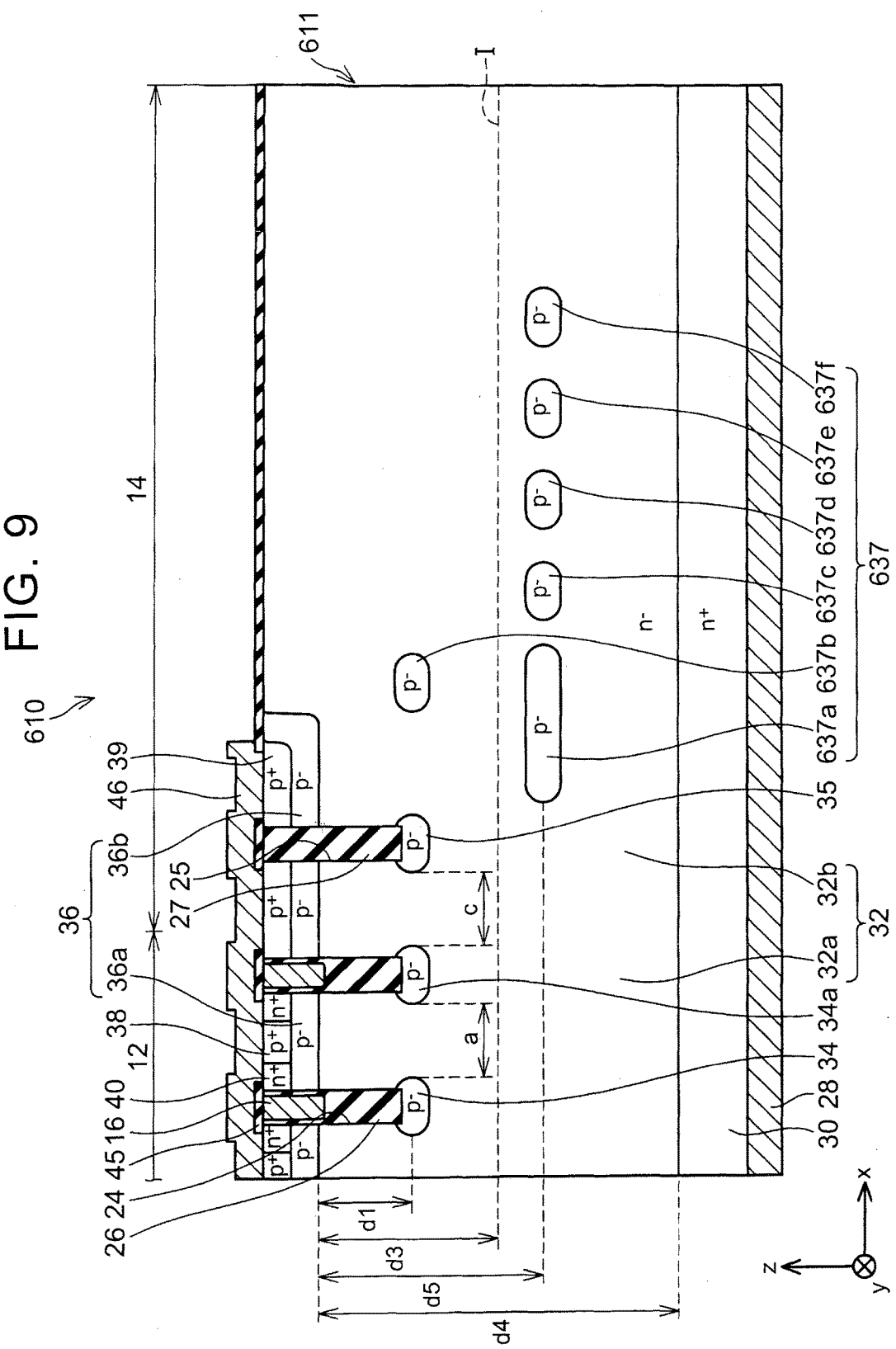
FIG. 9 is a drawing of a longitudinal section of a semiconductor device according to Embodiment 2 of the present invention.

Referring now to FIG. 9, Embodiment 2 of the present invention is described. A semiconductor device 610 of Embodiment 2 is different from the first embodiment in a position of diffusion regions 637a to 637f formed in a termination region 14. That is, the diffusion regions 637a, 637c to 637f are formed in a position of a depth d5 from a bottom face of a body region 36a. The diffusion region 637b is in a position of a depth d1 from the bottom face of the body region 36a (that is, the same depth as diffusion regions 34, 35). The diffusion regions 637a, 637c to 637f are placed closer to a reference depth than the diffusion regions 34 and the diffusion region 35. In other words, d5−d3<d3−d1 is established. The diffusion region 637a is configured such that its width in the x-direction (more strictly, a width in a direction toward an end of a semiconductor substrate 611 from its element-region-12 side) is larger than that of the diffusion regions 637b to 637f. Further, the diffusion region 637a is placed below the diffusion region 637b. In other words, when the semiconductor substrate 611 is viewed in a plane manner, the diffusion region 637a and the diffusion region 637b are placed so as to overlap each other. According to this configuration, the peak of the electric field intensity is formed in two places, i.e., the diffusion region 637a and the diffusion region 637b in a portion where the diffusion region 637a and the diffusion region 637b overlap each other. In view of this, in comparison with a case where the peak of the electric field intensity is formed in one place, it is possible to reduce a maximum value of the peak of the electric field intensity more. This accordingly makes it possible to more surely maintain a breakdown voltage of the termination region 14. Further, the width of the diffusion region 637a in the x-direction is set large in the present embodiment. Accordingly, even if the diffusion regions 637a, 637b are misaligned in a forming process of the diffusion regions 637, it is still possible to more surely form the diffusion region 637a below the diffusion region 637b. Further, the diffusion regions 637a, 637b are diffusion regions placed closest to the element region 12. A breakdown voltage is easy to decrease in that part of the termination region 14 which is closer to the element region 12. In view of this, when the diffusion regions 637a, 637b are configured to overlap each other, it is possible to maintain the breakdown voltage of the termination region 14 more appropriately. Note that, in the present embodiment, the diffusion region 637b fully overlaps the diffusion region 637a. However, this is not the only option, and the diffusion region 637b may partially overlap the diffusion region 637a.

The diffusion regions 637a, 637c to 637f are formed such that epitaxial growth of the drift region 32 is stopped once, so as to perform an ion implantation from a top face of the drift region 32 that is grown halfway, and then, the epitaxial growth is restarted. In order to reduce the maximum value of the peak of the electric field intensity, it is preferable for the diffusion regions 637a, 637b to be formed in a position that evenly divides a thickness of the drift region 32a. As described in the first embodiment, the diffusion regions 34, 35 are formed in a position in which d1≤(⅓)*d4 is satisfied. Accordingly, the diffusion region 637b is also formed in a position in which d1≤(⅓) d4 is satisfied. Accordingly, a range of a preferred position of the diffusion region 637a in which range the maximum value of the peak of the electric field intensity can be reduced is naturally a range in which the diffusion region 637a is placed closer to the reference depth than the diffusion region 637b (that is, a range in which d5−d3<d3−d1 is satisfied).

However, in the semiconductor device according to Embodiment 2 of the present invention, the diffusion regions 34, 35 (that is, the diffusion region 637b) may be placed closer to the reference depth d3 than the diffusion regions 637a, 637c to 637f. That is, in a case where the depth d1 of the diffusion regions 34, 35 (that is, the depth d1 of the diffusion region 637b) is deeper than ⅓ of the thickness of the drift region 32a (that is, d1>(⅓)*d4), the diffusion regions 637a, 637c to 637f may be formed in a position where the depth d5 thereof satisfies d5−d3>d3−d1. Hereby, a given interval is secured between the diffusion region 637a and the diffusion region 637b. This makes it possible to reduce the maximum value of the peak of the electric field intensity in the portion where the diffusion region 637a and the diffusion region 637b overlap each other. The same can be said for the following modifications (that is, the diffusion regions 34, 35 are placed closer to the reference depth d3 than the after-mentioned diffusion regions 737 so as to satisfy d5−d3>d3−d1).

Figure 10:
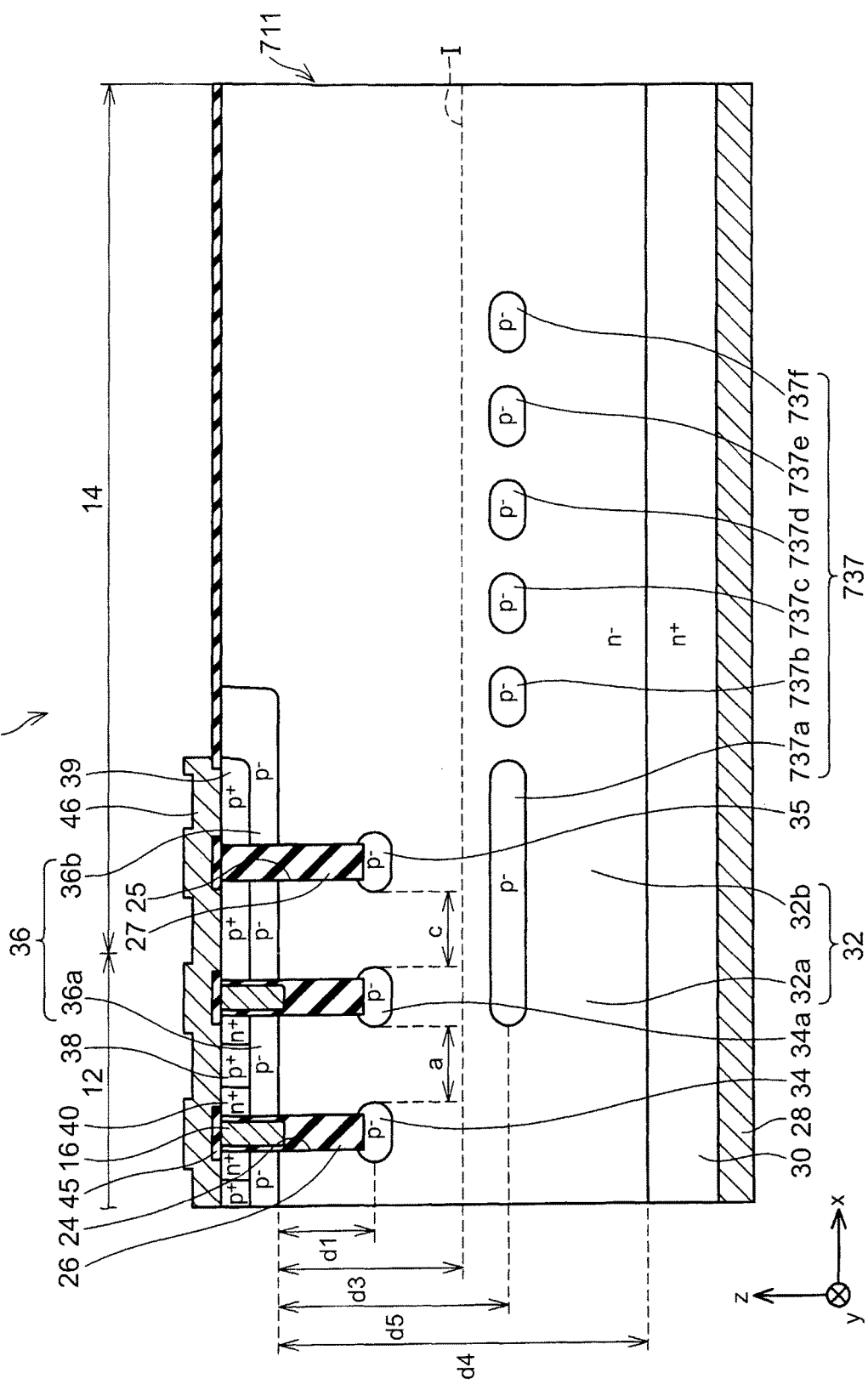
FIG. 10 is a drawing of a longitudinal section of a semiconductor device according to a sixth modification of the present invention.

Referring now to FIG. 10, a sixth modification of the present invention is described. In a semiconductor device 710 of the sixth modification, diffusion regions 737a to 737f are formed in a position of a depth d5 from a bottom face of a body region 36a. The diffusion region 737a is formed to have a large width in the x-direction so that the diffusion region 737a is placed below an end-side diffusion region 34a and a diffusion region 35. Generally, a breakdown voltage is easy to decrease in a boundary portion between an element region 12 and a termination region 14. According to the configuration of the sixth modification, since the peak of the electric field intensity is formed in two places, i.e., the end-side diffusion region 34a and the diffusion region 737a (or two places of the diffusion region 35 and the diffusion region 737a), it is possible to reduce maximum values of the peak of the electric field intensity. Accordingly, it is possible to yield the same effect as in Embodiment 2, and it is possible to retrain a decrease in the breakdown voltage particularly in the boundary portion. Note that, in the sixth modification, the end-side diffusion region 34a fully overlaps the diffusion region 737a. However, this is not the only option, and the end-side diffusion region 34a may partially overlap the diffusion region 737a. Alternatively, the diffusion region 737a may overlap two or more diffusion regions 34. The same can be said for the following modifications.

Figure 11:
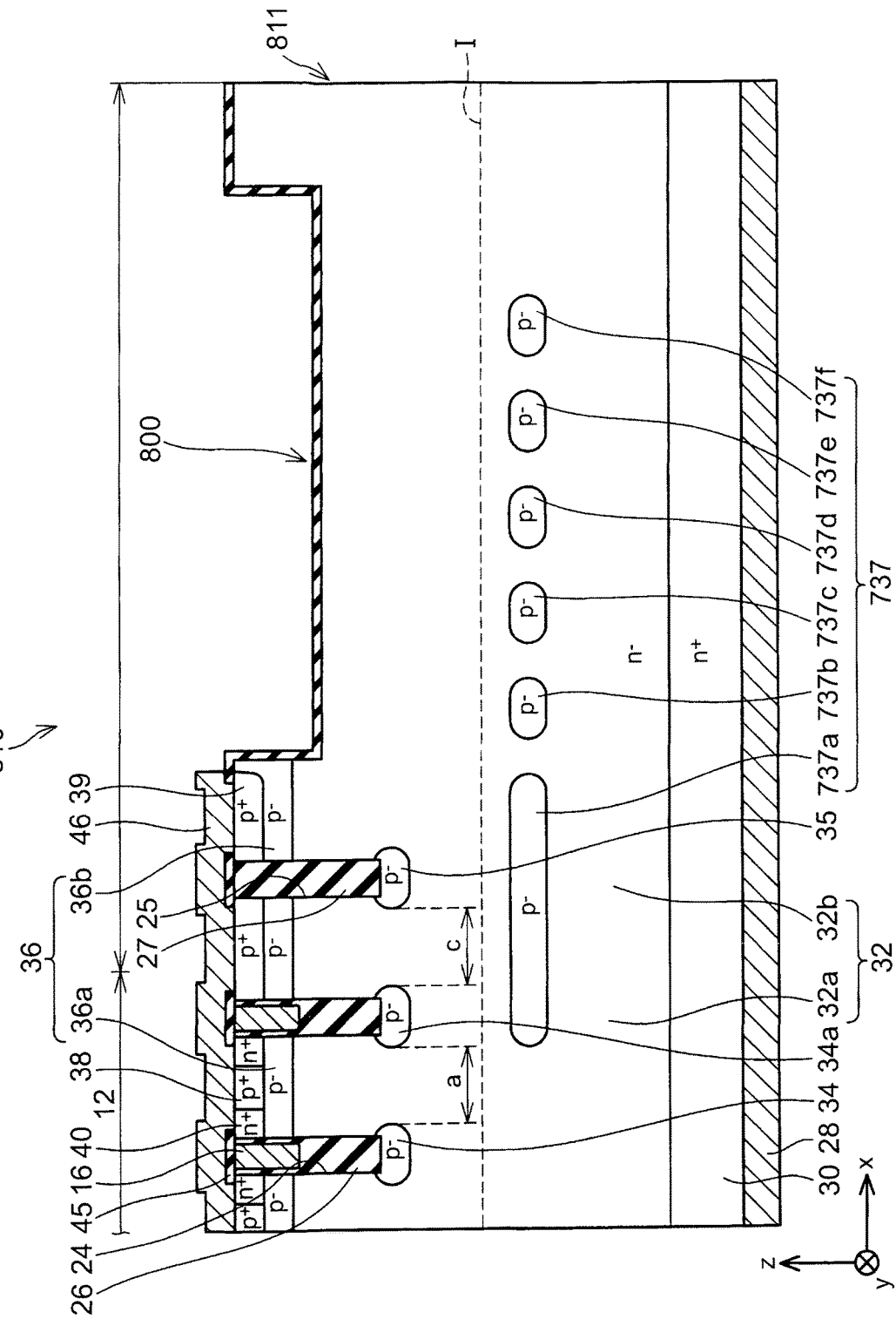
FIG. 11 is a drawing of a longitudinal section of a semiconductor device according to a seventh modification of the present invention.

Referring now to FIG. 11, a seventh modification of the present invention is described. A semiconductor device 810 of the seventh modification is a semiconductor device in which a mesa region 800 is formed in part of the termination region 14 of the semiconductor device 710 of the sixth modification. The mesa region 800 has generally the same structure as the mesa region 200 of the second modification. According to this configuration, it is possible to yield the same effect as in Embodiment 2, and it is possible to reduce an electric field intensity on a top face of a semiconductor substrate 811 in the termination region 14.

Figure 12:
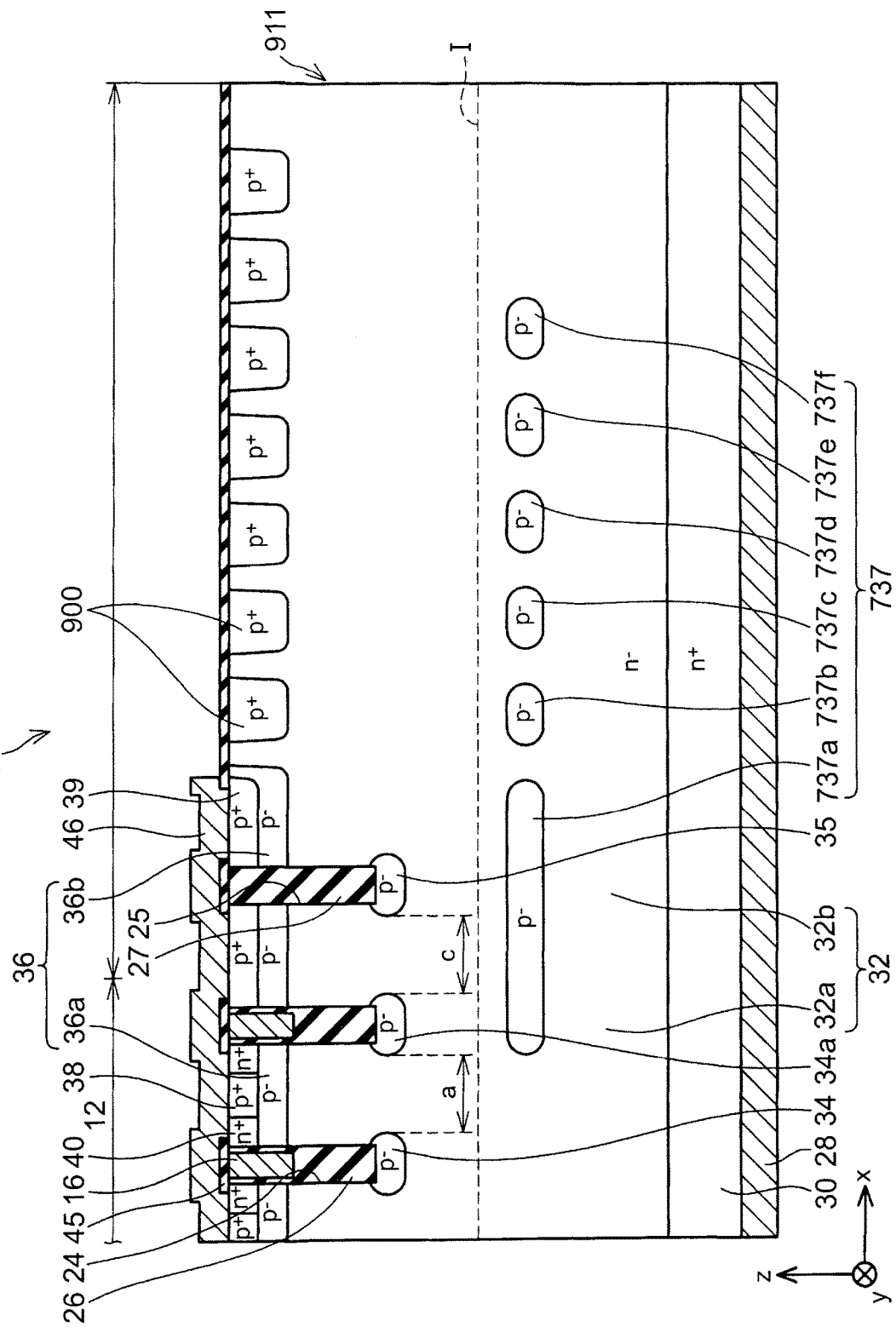
FIG. 12 is a drawing of a longitudinal section of a semiconductor device according to an eighth modification of the present invention.

Referring now to FIG. 12, an eighth modification of the present invention is described. A semiconductor device 910 of the eighth modification is a semiconductor device in which a plurality of p+ FLR regions 900 is formed in the termination region 14 of the semiconductor device 710 of the sixth modification. The FLR regions 900 have generally the same structure as the FLR regions 300 of the third modification. Even with this configuration, it is possible to yield the same effect as in Embodiment 2, and it is possible to reduce an electric field intensity on a top face of a semiconductor substrate 911 in the termination region 14.

Figure 13:
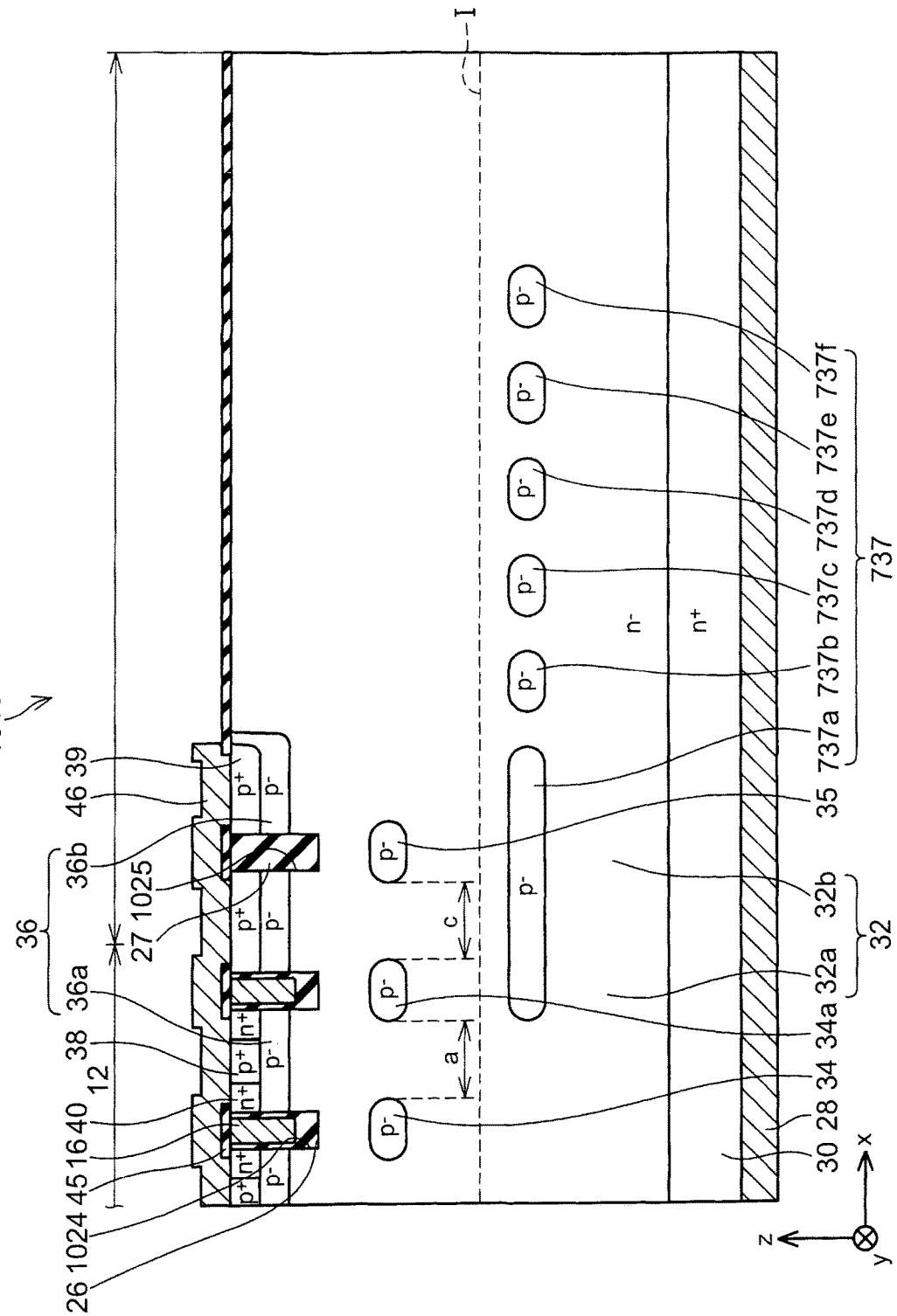
FIG. 13 is a drawing of a longitudinal section of a semiconductor device according to a ninth modification of the present invention.

Referring now to FIG. 13, a ninth modification of the present invention is described. In a semiconductor device 1010 of a ninth modification, bottom ends of gate trenches 1024 are made shallower than the bottom ends of the gate trenches 24, and bottom portions of the gate trenches 1024 are separated from diffusion regions 34 by a drift region 32a. Similarly, a bottom end of a dummy trench 1025 is made shallower than the bottom end of the dummy trench 25, and a bottom portion of the dummy trench 1025 is separated from a diffusion region 35 by a drift region 32b. Even with this configuration, it is possible to yield the same effect as in Embodiment 2.

The embodiments of the present invention have been described above in detail, but these embodiments are only examples, and the semiconductor device of the present invention includes embodiments obtained by variously modifying or changing the above embodiments.

For example, it is not necessary for all the diffusion regions 37 to be placed closer to the reference depth than the diffusion regions 34, 35. If the breakdown voltage of the termination region 14 is relatively higher than the breakdown voltage of the element region 12, only one diffusion region 37 may be placed closer to the reference depth than the diffusion regions 34, 35. Further, it is not necessary for the diffusion regions 37 to be placed generally at even intervals. Further, two or more diffusion regions 37 may be placed below the bottom face of the body region 36b. Furthermore, it is not necessary for all the diffusion regions 37 to be placed on an outer periphery side of the diffusion region 35. For example, the diffusion region 37a may be placed closer to the element region 12 than the diffusion region 35.

Further, it is not necessary for the diffusion regions 34 to have the same depth. In this case, at least one diffusion region 37 is placed further closer to the reference depth than a diffusion region 34 placed closest to the reference depth, so as to adjust the position of the diffusion region 37 so that the breakdown voltage of the termination region 14 becomes relatively higher than the breakdown voltage of the element region 12.

Further, the depth d5 of the diffusion regions 637a, 637c to 637f and the diffusion regions 737 is deeper than the reference depth d3, but this is not the only option. As long as the aforementioned condition of d5−d3<d3−d1 is satisfied, the depth d5 may be shallower than the reference depth d3. In the present embodiment, the diffusion regions 34, 35 (and the diffusion region 637b) are formed in the position in which d1≤(⅓)*d4 is satisfied. In view of this, even if the depth d5 of the diffusion regions 637a, 637c to 637f and the diffusion region 737 is shallower than the reference depth d3, a given interval is secured between the diffusion region 637a and the diffusion region 637b. Similarly, a given interval is secured between the diffusion regions 34, 35 and the diffusion region 737a. Accordingly, even with this configuration, it is possible to reduce the maximum value of the peak of the electric field intensity in the portion where the diffusion region 637a and the diffusion region 637b overlap each other and in the portion where the diffusion regions 34, 35 and the diffusion region 737a overlap each other, when the semiconductor substrate is viewed in a planer manner.

Further, in Embodiment 2, the diffusion region 637a may be formed to have a large width in the x-direction so that the diffusion region 637a is placed below the end-side diffusion region 34a and the diffusion region 35. That is, when the semiconductor substrate is viewed in a plane manner, the end-side diffusion region 34a and the diffusion region 637a placed closest to the element region may have overlap portions that overlap each other.

Further, two or more dummy trenches 25 and diffusion regions 35 may be formed. An electric conductor may be further formed inside the dummy trench 25. Further, two or more element regions 12 may be formed in the semiconductor substrate 11. Further, the present invention is not limited to an MOS, and can be applied to general high-power switching elements including an IGBT.

The concrete examples of the present invention have been described in detail, but these are merely examples. The present invention includes embodiments obtained by variously modifying or altering the concrete examples exemplified as above.

What is claimed is:

1. A semiconductor device comprising:
a semiconductor substrate having an element region and a termination region, the termination region surrounding the element region, wherein:
the element region includes
a first body region having a first conductivity type and being placed in a range facing a top face of the semiconductor substrate,
a first drift region having a second conductivity type and making contact with a bottom face of the first body region, and
a plurality of first floating regions, each of the first floating regions having the first conductivity type and being surrounded by the first drift region, wherein the plurality of first floating regions comprises all of We floating regions in the element region;
the termination region includes
a second drift region having the second conductivity type, and
a plurality of second floating regions, each of the second floating regions having the first conductivity type and being surrounded by the second drift region;
the second floating regions surround an outer periphery of the element region; and
when a depth of a center of the first drift region in a thickness direction of the semiconductor substrate is taken as a reference depth, at least one of the second floating regions is placed closer to the reference depth than all of the first floating regions, and
when the semiconductor substrate is viewed in a plane manner, at least two of the second floating regions have overlapping portions that overlap each other.

2. The semiconductor device according to claim 1, wherein:
a second body region is formed in part of the termination region, the second body region having the first conductivity type, being placed in a range facing the top face of the semiconductor substrate and being formed continuously from the first body region;
the second drift region makes contact with a bottom face and side faces of the second body region; and
when the semiconductor substrate is viewed in a plane manner, at least one of the second floating regions has an overlapping portion with the second body region.

3. The semiconductor device according to claim 1, wherein
the first floating regions are placed at a predetermined interval from an element-region side toward a termination-region side in a predetermined depth in the thickness direction.

4. The semiconductor device according to claim 1, wherein
when the semiconductor substrate is viewed in a plane manner, the at least two of the second floating regions are placed closest to the element region among the second floating regions.

5. The semiconductor device according to claim 1, wherein:
- a second body region is formed in part of the termination region, the second body region having the first conductivity type, being placed in a range facing the top face of the semiconductor substrate and being formed continuously from the first body region;
- the second drift region makes contact with a bottom face and side faces of the second body region;
- the first floating regions are placed at a predetermined interval from an element-region side toward a termination-region side in a predetermined depth in the thickness direction;
- the termination region includes a dummy trench, an insulator, and a third floating region;
- the dummy trench penetrates through the second body region and extends in the second drift region;
- the insulator is placed in the dummy trench;
- the third floating region is placed in a bottom portion of the dummy trench or below the dummy trench, and has the first conductivity type;
- the dummy trench surrounds the outer periphery of the element region;
- the third floating region is placed in the predetermined depth and surrounded by the second drift region; and
- an interval between the third floating region and one of the second floating regions is a half or less of the predetermined interval, the one of the second floating regions being adjacent to the third floating region and being located at an opposite side to the element region with respect to the third floating region.

6. The semiconductor device according to claim 5, wherein
the third floating region surrounds the bottom portion of the dummy trench.

7. The semiconductor device according to claim 1, wherein:
- the element region includes a gate electrode and a second insulator;
- the gate electrode is placed inside a gate trench and is opposite to the first body region, the gate trench penetrating through the first body region and extending in the first drift region;
- the second insulator is placed between the gate electrode and an inner wall of the gate trench; and
- the plurality of first floating regions in the element region surround a bottom portion of the gate trench.

8. A semiconductor device comprising:
a semiconductor substrate having an element region and a termination region, the termination region surrounding the element region, wherein:
the element region includes
- a first body region having a first conductivity type and being placed in a range facing a top face of the semiconductor substrate,
- a first drift region having a second conductivity type and making contact with a bottom face of the first body region, and
- a plurality of first floating regions, each of the first floating regions having the first conductivity type and being surrounded by the first drift region, wherein the plurality of first floating regions comprises all floating regions that are entirely included in the element region;
the termination region includes
- a second drift region having the second conductivity type, and
- a plurality of second floating regions, each of the second floating regions having the first conductivity type and being surrounded by the second drift region;

the second floating regions surround an outer periphery of the element region; and
when a depth of a center of the first drift region in a thickness direction of the semiconductor substrate is taken as a reference depth, at least one of the second floating regions is placed closer to the reference depth than all of the first floating regions, wherein
when the semiconductor substrate is viewed in a plane manner, at least one of the first floating regions and a fourth floating region that extends from the element region to the terminal region overlap each other in the element region.

9. A semiconductor device comprising:
a semiconductor substrate having an element region and a termination region, the termination region surrounding the element region, wherein:
the element region includes
- a first body region having a first conductivity type and being placed in a range facing a top face of the semiconductor substrate,
- a first drift region having a second conductivity type and making contact with a bottom face of the first body region, and
- a plurality of first floating regions, each of the first floating regions having the first conductivity type and being surrounded by the first drift region;

the termination region includes
- a second drift region having the second conductivity type, and
- a plurality of second floating regions, each of the second floating regions having the first conductivity type and being surrounded by the second drift region;

the second floating regions surround an outer periphery of the element region; and
when a depth of a center of the first drift region in a thickness direction of the semiconductor substrate is taken as a reference depth, at least one of the second floating regions is placed closer to the reference depth than all of the first floating regions, wherein
the first floating regions are placed at a predetermined interval from an element-region side toward a termination-region side in a predetermined depth in the thickness direction, and
an interval between one of the first floating regions and one of the second floating regions is ½ or less of the predetermined interval, the one of the second floating regions being adjacent to the one of the first floating regions.

* * * * *